(12) United States Patent
Sakaguchi

(10) Patent No.: US 8,969,860 B2
(45) Date of Patent: Mar. 3, 2015

(54) ORGANIC ELECTROLUMINESCENT LIGHTING DEVICE AND METHOD FOR MANUFACTURING THE LIGHTING DEVICE

(75) Inventor: Yoshikazu Sakaguchi, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 13/885,448

(22) PCT Filed: Dec. 26, 2011

(86) PCT No.: PCT/JP2011/080009
§ 371 (c)(1),
(2), (4) Date: May 15, 2013

(87) PCT Pub. No.: WO2012/090903
PCT Pub. Date: Jul. 5, 2012

(65) Prior Publication Data
US 2013/0234127 A1        Sep. 12, 2013

(30) Foreign Application Priority Data
Dec. 28, 2010    (JP) .................. 2010-293101

(51) Int. Cl.
*H01L 51/52*        (2006.01)
*H01L 51/56*        (2006.01)
(Continued)

(52) U.S. Cl.
CPC ........ *H01L 51/5203* (2013.01); *H01L 51/5212* (2013.01); *H05B 33/10* (2013.01); *H05B 33/26* (2013.01); *H01L 51/56* (2013.01)
USPC ............................................. 257/40; 438/46

(58) Field of Classification Search
CPC ........ H01I 27/3276; H01I 51/50; H01I 51/52; H01I 51/5212; H01I 51/5203; H01L 27/3244; H01L 27/3276; H01L 51/5203; H01L 51/5228; H01L 51/50; H01L 51/5012; H01L 51/5212; H01L 51/52
USPC ..................................................... 257/40, 59
See application file for complete search history.

(56) References Cited

U.S. PATENT DOCUMENTS

| 2003/0038591 | A1* | 2/2003 | Kim .............................. 313/504 |
| 2008/0088227 | A1* | 4/2008 | Lee ............................... 313/504 |
| 2010/0176385 | A1* | 7/2010 | Lifka et al. ..................... 257/40 |

FOREIGN PATENT DOCUMENTS

| JP | 2000-231985 A | 8/2000 |
| JP | 200384683 A | 3/2003 |

(Continued)

OTHER PUBLICATIONS

International Search Report for PCT/JP2011/080009 dated Feb. 14, 2012.
(Continued)

*Primary Examiner* — Whitney T Moore
(74) *Attorney, Agent, or Firm* — Sughrue Mion, PLLC

(57) ABSTRACT

The present invention addresses the problem of providing an organic electroluminescent lighting device in which it is difficult for an organic light emitting film to be scratched. The organic electroluminescent lighting device includes: transparent substrate 1; a plurality of transparent first electrode films 2 spaced from each other on the surface of transparent substrate 1; auxiliary electrode films 3 arranged between the plurality of first electrode films 2, having electrical resistivity lower than that of first electrode films 2, and electrically connected to the plurality of first electrode films 2; insulating films 6 covering auxiliary electrode films 3; power supply terminal films arranged on the surface of transparent substrate 1 adjacently to an arrangement region in which the plurality of first electrode films 2 and auxiliary electrode films 3 are arranged, and electrically connected to the plurality of first electrode films 2 and auxiliary electrode films 3; organic light emitting film 7 covering first electrode films 2 and insulating films 6; and second electrode film 8 covering organic light emitting film 7.

6 Claims, 7 Drawing Sheets

(51) Int. Cl.
*H05B 33/10* (2006.01)
*H05B 33/26* (2006.01)

(56) References Cited

FOREIGN PATENT DOCUMENTS

| | | |
|---|---|---|
| JP | 2004-014128 A | 1/2004 |
| JP | 2004-152699 A | 5/2004 |
| JP | 2006-278241 A | 10/2006 |
| JP | 2007-073305 A | 3/2007 |
| JP | 2008-103305 A | 5/2008 |
| JP | 2009-140817 A | 6/2009 |
| JP | 2010-108851 A | 5/2010 |
| JP | 2010-198935 A | 9/2010 |
| JP | 2010-533355 A | 10/2010 |

OTHER PUBLICATIONS

Office Action dated May 13, 2014, issued by the Japan Patent Office in corresponding Japanese Application No. 2012-550922.
Communication dated Aug. 19, 2014, issued by the Japanese Patent Office in counterpart Application No. 2012550922.

* cited by examiner

ORGANIC ELECTROLUMINESCENT LIGHTING DEVICE AND METHOD FOR MANUFACTURING THE LIGHTING DEVICE

This is a National Stage Entry of Application No. PCT/JP2011/080009 filed Dec. 26, 2011, claiming priority based on Japanese Patent Application No. 2010-293101 filed Dec. 28, 2010, the contents of all of which are incorporated herein by reference in their entirety.

TECHNICAL FIELD

The present invention relates to an organic electroluminescent lighting device that includes an organic light emitting film as a light source, and a method for manufacturing the lighting device.

BACKGROUND ART

As one of lighting devices, there is known an organic electroluminescent lighting device that includes an organic light emitting film as a light source. In the organic electroluminescent lighting device, the organic light emitting film is sandwiched between a transparent anode film and a cathode film, and emits light when an electric field is generated between the electrodes. The light is transmitted through the anode film to be applied to the outside. For the anode film, a transparent conductive material (or transparent metal oxide) such as ITO (Indium Tin Oxide), ZnO, SnO 2 (Nesa glass) is used. The transparent conductive material (or transparent metal oxide) has relatively large electrical resistivity $\rho(\Omega \cdot m)$. Power is generally supplied to the anode film from both of its ends. Accordingly, wring resistance is larger farther from both ends. Since the increase of the wiring resistance is accompanied by the increase of a voltage drop, the voltage is no longer applied uniformly to the entire organic light emitting film. The luminance of the organic light emitting film depends on the voltage. Thus, when the voltage is not applied uniformly to the organic light emitting film, there is a possibility that the luminance of the organic light emitting film will be nonuniform. To reduce the wiring resistance, therefore, there is known a technology of forming auxiliary electrode films whose resistance is lower than the anode film in a lattice shape on the surface of the anode film (JP2004-14128A).

FIG. 1A is a top view showing organic electroluminescent lighting device 100 according to the present invention. FIG. 1B is a sectional view cut along the line A-A shown in FIG. 1A. FIG. 1C is a sectional view cut along the line B-B shown in FIG. 1A. FIG. 1A shows the seen-through state of the inside of organic electroluminescent lighting device 100. FIGS. 1B and 1C show the separated state of organic light emitting film 114 and electrode film 115 from organic electroluminescent lighting device 100. FIGS. 2A to 2E are top views each showing the manufacturing process of organic electroluminescent lighting device 100 shown in FIG. 1A.

To manufacture organic electroluminescent lighting device 100 shown in FIG. 1A, first, a sheet of electrode film 111, power supply terminal films 121, and power supply terminal films 131 are formed on the surface of transparent substrate 110 (refer to FIG. 2A). Electrode film 111 and power supply terminal film 121 are integral with each other, and power supply terminal film 131 is separated from electrode film 111 and power supply terminal film 121. For electrode film 111 and power supply terminal films 121 and 131, transparent conductive materials (or transparent metal oxides) (e.g., ITO) are used. Then, auxiliary electrode films 112 are formed in a lattice shape on the surface of electrode film 111 by using metallic materials (e.g., chromium) whose electrical resistivity is lower than electrode film 111 (refer to FIG. 2B). Then, insulating films 113 are formed on the surfaces of auxiliary electrode films 112 (refer to FIG. 2C). Then, organic light emitting film 114 is formed on the surface of electrode film 111 and the surfaces of insulating films 113 (refer to FIG. 2D). Lastly, electrode film 115 is formed on the surface of organic light emitting film 114 and the surfaces of power supply terminal films 131 (refer to FIG. 2E).

In organic electroluminescent lighting device 100 thus configured, when power is supplied between power supply terminal film 121 and power supply terminal film 131 from a power source, organic light emitting film 114 emits light. At this time, since there are auxiliary electrode films 112 formed on the surface of electrode film 111, wiring resistance is reduced. Thus, the value of a dropping voltage is also reduced. As a result, nonuniformity of luminance in the organic light emitting film can be prevented.

CITATION LIST

Patent Literature 1: JP20004-14128A

SUMMARY OF INVENTION

Problems to be Solved by Invention

However, in organic electroluminescent lighting device 100 shown in FIG. 1A, as shown in FIGS. 1B and 1C, since auxiliary electrode film 112 covered with insulating film 113 has been formed on the surface of electrode film 111, auxiliary electrode film 112 is a convex portion that protrudes from the surface of electrode film 111. Generally, the film thickness of auxiliary electrode film 112 including the portion covered with insulating film 113 is 1 to 2 μm, and the film thickness of organic light emitting film 114 is around 300 nm. Accordingly, auxiliary electrode film 112 is formed into a structure much thicker than the film thickness of organic light emitting film 114. Consequently, there is a possibility that organic light emitting film 114 will be cut due to the thickness of auxiliary electrode film 112 thereby causing a problem such as short-circuiting or circuit opening.

It is therefore an object of the present invention to provide an organic electroluminescent lighting device in which it is difficult for an organic light emitting film to be scratched, thereby providing a quality guarantee with improved reliability, and a method for manufacturing the lighting device.

Solution to Problem

To achieve the object, an organic electroluminescent lighting device according to the present invention includes: a transparent substrate; a plurality of transparent first electrode films spaced from each other on the surface of the transparent substrate; auxiliary electrode films arranged between the plurality of first electrode films, having electrical resistivity that is lower than that of the first electrode films, and electrically connected to the plurality of first electrode films; insulating films covering the auxiliary electrode films; power supply terminal films arranged on the surface of the transparent substrate adjacently to an arrangement region in which the plurality of first electrode films and the auxiliary electrode films are arranged, and electrically connected to the plurality of first electrode films and the auxiliary electrode films; an organic light emitting film covering the first electrode films and the insulating films; and a second electrode film covering the organic light emitting film.

To achieve the object, a method for manufacturing an organic electroluminescent lighting device according to the present invention includes: the first step of forming a plurality of transparent first electrode films spaced from each other on the surface of a transparent substrate, auxiliary electrode films arranged between the plurality of first electrode films, having electrical resistivity lower than that of the first electrode films, and electrically connected to the plurality of first electrode films, and power supply terminal films arranged adjacently to an arrangement region in which the plurality of first electrode films and the auxiliary electrode films are arranged, and electrically connected to the plurality of first electrode films and the auxiliary electrode films; the second step of forming insulating films covering the auxiliary electrode films; the third step of forming an organic light emitting film covering the first electrode films and the insulating films; and the fourth step of forming a second electrode film covering the organic light emitting film.

Effects of Invention

According to the present invention, the auxiliary electrode film covered with the insulating film is formed not on the surface of the first electrode film but between the first electrode films. Accordingly, auxiliary electrode film has a portion which protrudes from the first electrode film and the height of the portion is lower than the structure of the auxiliary electrode film formed on the surface of the first electrode film. This makes it difficult for the organic light emitting film, to be scratched, thus improving the reliability of quality guarantee. Employing this configuration or structure can provide the aforementioned effect without increasing the number of steps or process loads and without changing manufacturing costs.

Figure 3A:
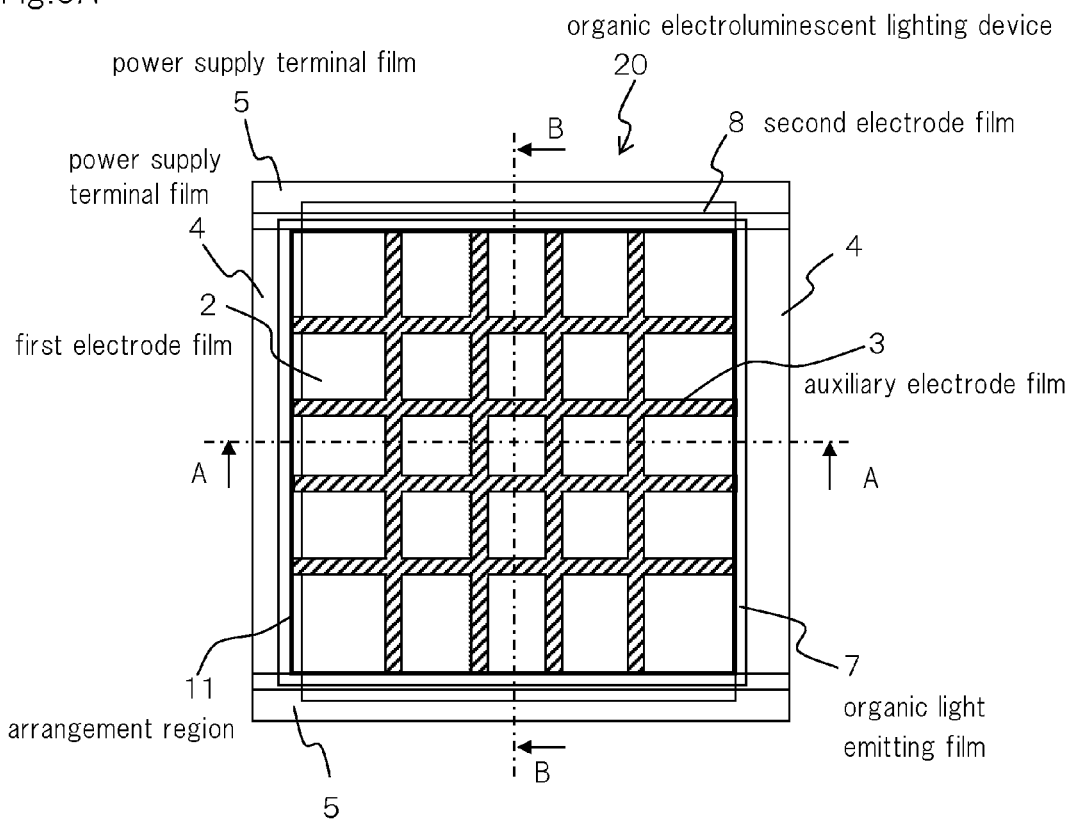
FIG. 3A A top view showing an organic electroluminescent lighting device according to the first embodiment of the present invention.
Figure 3B:
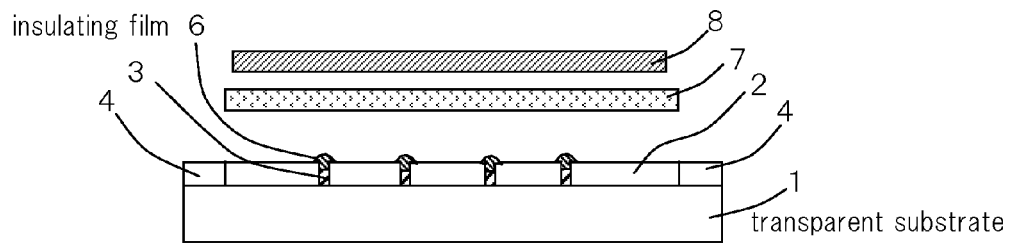
FIG. 3B A sectional view cut along the line A-A shown in FIG. 3A.
Figure 3C:
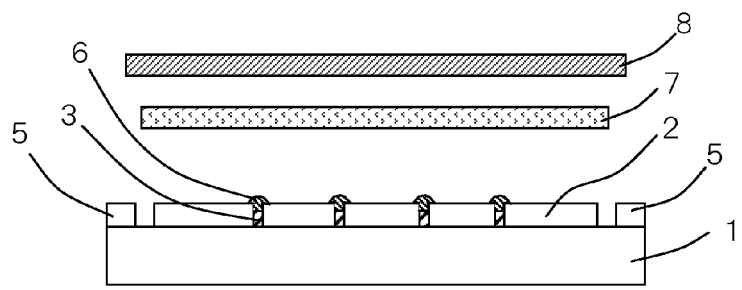
FIG. 3C A sectional view cut along the line B-B shown in FIG. 3A.

DESCRIPTION OF EMBODIMENTS (First Embodiment)
FIG. 3A is a top view showing organic electroluminescent lighting device 10 according to the first embodiment of the present invention. FIG. 3B is a sectional view cut along the line A-A shown in FIG. 3A. FIG. 3C is a sectional view cut along the line B-B shown in FIG. 3A. FIG. 3A shows the seen-through state of the inside of organic electroluminescent lighting device 10. FIGS. 3B and 3C show the separated state of organic light emitting film 7 and second electrode film 8 from organic electroluminescent lighting device 10.

Organic electroluminescent lighting device 10 according to the embodiment includes, for example, a plurality of first rectangular electrode films 2, auxiliary electrode films 3, power supply terminal films 4, and power supply terminal films 5 (other power supply terminal films) formed on the surface of alkali-free glass transparent substrate 1.

First electrode film 2, which is an anode, is made of a transparent conductive material (or transparent metal oxide) (e.g., ITO). First electrode films 2 are spaced from each other in a matrix on the surface of transparent substrate 1.

Auxiliary electrode film 3 is made of a metallic material such as Al (aluminum), Cr (chromium), Mo (molybdenum), Mo—Nb (molybdenum-niobium alloy), or Al—Nd (aluminum-neodymium alloy) having electrical resistivity $\rho(\Omega \cdot m)$ lower than that of first electrode film 2. Auxiliary electrode films 3 are arranged between first electrode films 2 in a lattice shape. The surfaces of auxiliary electrode films 3 are covered with insulating films 6. The surfaces of insulating films 6, which have tapered ends, are round.

Power supply terminal 4 is formed adjacently to arrangement region 11 where first electrode film 2 and auxiliary electrode film 3 are arranged. Power supply terminal 5 is formed away from first electrode film 2 and power supply terminal film 4. Power supply terminal 5 is made of a transparent conductive material (or transparent metal oxide) as in the case of first electrode film 2.

First electrode film 2 and insulating film 6 are covered with organic light emitting film 7. Organic light emitting film 7 includes a light emitting layer (not shown) and two transport layers (not shown) sandwiching the light emitting layer.

The surface of organic light emitting film 7 and power supply terminal film 5 are covered with second electrode film 8. More specifically, second electrode film 8 is smaller than organic light emitting film 7 with respect to the side of power supply terminal film 4, and does not need to cover power supply terminal film 5 as long as it makes contact with power supply terminal film 5 with respect to the side of power supply terminal film 5. Second electrode film 8, which is a cathode, is made of a metallic material such as Al or Ag.

In organic electroluminescent lighting device 10 thus configured, when voltage is applied between power supply terminal film 4 and power supply terminal film 5 from a power source, an electric field is generated between first electrode film 2 and second electrode film 8. Accordingly, organic light emitting film 7 emits light. The light is transmitted through first electrode film 2 to be applied to the outside. Referring to FIGS. 4A to 4E, the manufacturing process of organic electroluminescent lighting device 10 of the embodiment will be described. FIGS. 4A to 4E are top views showing the manufacturing process of organic electroluminescent lighting device 10 of the embodiment.

Figure 4A:
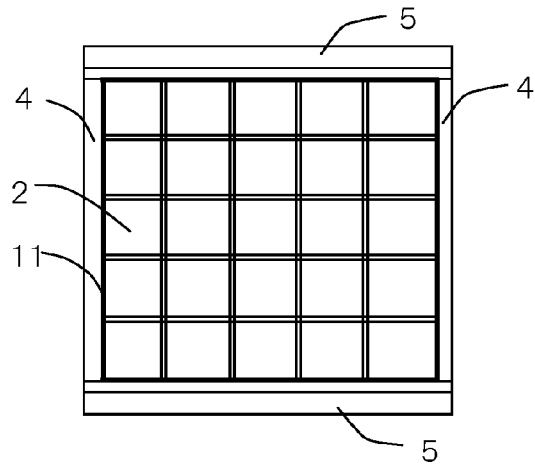
FIG. 4A A top view showing a part of the manufacturing process of the organic electroluminescent lighting device shown in FIG. 3A.

First, through a sputtering process using a shadow mask, a plurality of first electrode films 2 and power supply terminal films 4 and 5 are formed on the surface of transparent substrate 1 (refer to FIG. 4A). The plurality of first electrode films 2 are spaced from each other in a matrix. Power supply terminal film 4 is formed adjacently to arrangement region 11. The plurality of first electrode films 2 and power supply terminal films 4 and 5 can be formed by executing patterning on one transparent conductive film (or transparent metal oxide film) through a photoetching process. In this case, the etching can be either dry etching or wet etching. Not limited to the matrix, the plurality of first electrode films 2 can be formed into a polygonal lattice shape, a comb shape or a ladder shape.

Figure 4B:
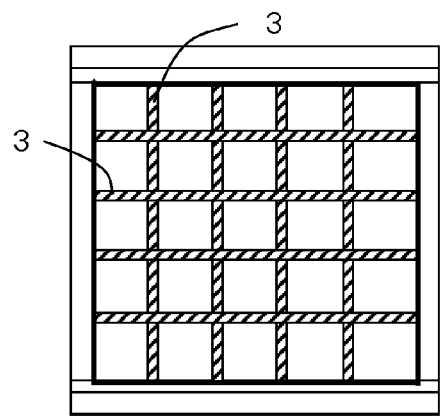
FIG. 4B A top view showing the next manufacturing process of the manufacturing process shown in FIG. 4A.

Then, auxiliary electrode films 3 are formed in a lattice shape between the plurality of first electrode films 2 (refer to FIG. 4B). To form auxiliary electrode films 3, the sputtering process using the shadow mask or the process of forming a metal film on the entire surface of each first electrode film 2 and then removing a portion other than between first electrode films 2 by photoetching can be employed.

Figure 4C:
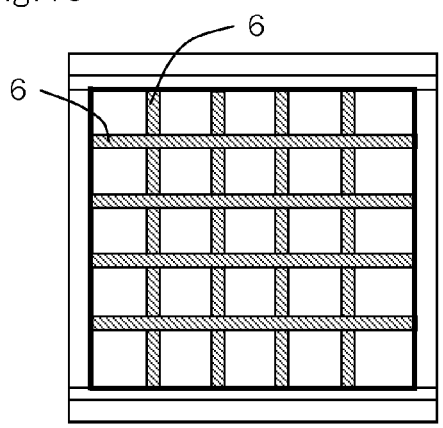
FIG. 4C A top view showing the next manufacturing process of the manufacturing process shown in FIG. 4B.

Then, insulating film 6 is formed on the surface of auxiliary electrode film 3 by depositing a photoresist (refer to FIG. 4C). In this case, photoresists can be deposited between first electrode film 2 and power supply terminal film 5 and between power supply terminal film 4 and power supply terminal film 5. Insulating film 6 or a photoresist portion can be formed by using, in place of the photoresist, an insulating thermosetting or ultraviolet curable polymer resist material. In this case, a direct drawing process such as an ink jet method or a screen printing method can be used. In place of the photoresist, an inorganic film represented by SiNx or SiOx can be formed as insulating film 6. The inorganic film is formed by vacuum deposition or CVD (Chemical Vapor Deposition). The inorganic film can be patterned by using the shadow mask or the photoetching process.

Figure 4D:
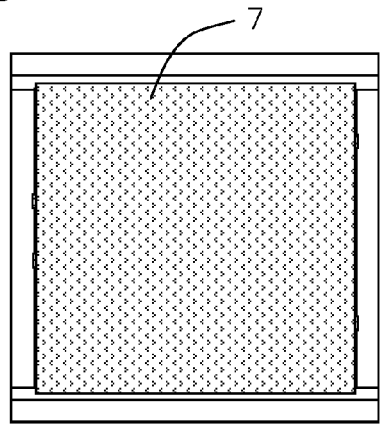
FIG. 4D A top view showing the next manufacturing process of the manufacturing process shown in FIG. 4C.

Then, organic light emitting film 7 is formed by vacuum deposition using the shadow mask to cover the surface of first electrode film 2 and the surface of insulating film 6 (refer to FIG. 4D).

Figure 4E:
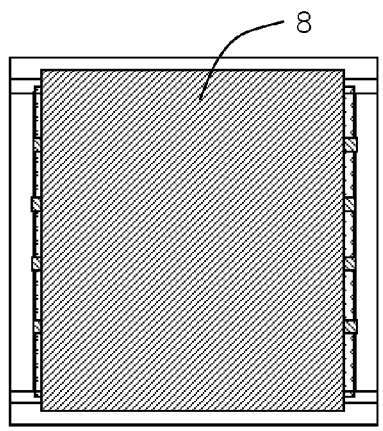
FIG. 4E A top view showing the next manufacturing process of the manufacturing process shown in FIG. 4D.

Lastly, second electrode film 8 is formed to cover the surface of organic light emitting film 7 and power supply terminal film 5 (refer to FIG. 4E).

According to organic electroluminescent lighting device 10 of the embodiment thus manufactured, auxiliary electrode film 3 is formed not on the surface of first electrode film 2 but between first electrode films 2. Accordingly, auxiliary electrode film 3 which is covered with insulating film 6 has a portion which protrudes from first electrode film 2 and the height of the portion is lower than the structure of auxiliary electrode film 3 formed on the surface of first electrode film 2. This makes it difficult for organic light emitting film 7 to be scratched. As a result, reliability can be improved by preventing unlighting caused by short-circuiting during lighting of the organic electroluminescent lighting device. In the embodiment, auxiliary electrode film 3 is thinner than first electrode film 2. However, auxiliary electrode film 3 can be thicker than first electrode film 2.

According to organic electroluminescent lighting device 10 of the embodiment, the device has an island structure in which the transparent electrode film whose electrical resistivity is relatively larger consists of the plurality of first electrode films 2 are apart from each other, and each first electrode film 2 is surrounded with auxiliary electrode film 3 lower in electrical resistivity than first electrode film 2. Accordingly, because the length of the transparent electrode film contributing to wiring resistance is smaller and voltage drop is within each first electrode film 2, electronic carriers are uniformly injected into organic light emitting film 7 compared with organic electroluminescent lighting device 100 shown in FIG. 1A. As a result, the effect of reducing uneven luminance provided by organic electroluminescent lighting device 10 of the embodiment is larger than that provided by organic electroluminescent lighting device 100 shown in FIG. 1A. Moreover, in organic electroluminescent lighting device 10 of the embodiment, there is no increase in number of steps compared with the manufacturing steps of organic electroluminescent lighting device 100 shown in FIGS. 2A to 2E. Thus, an organic electroluminescent lighting device in which there is no luminance unevenness and in which it is difficult for the organic light emitting film to be scratched (high quality) can be manufactured without increasing manufacturing costs.

(Second Embodiment)

Figure 5A:
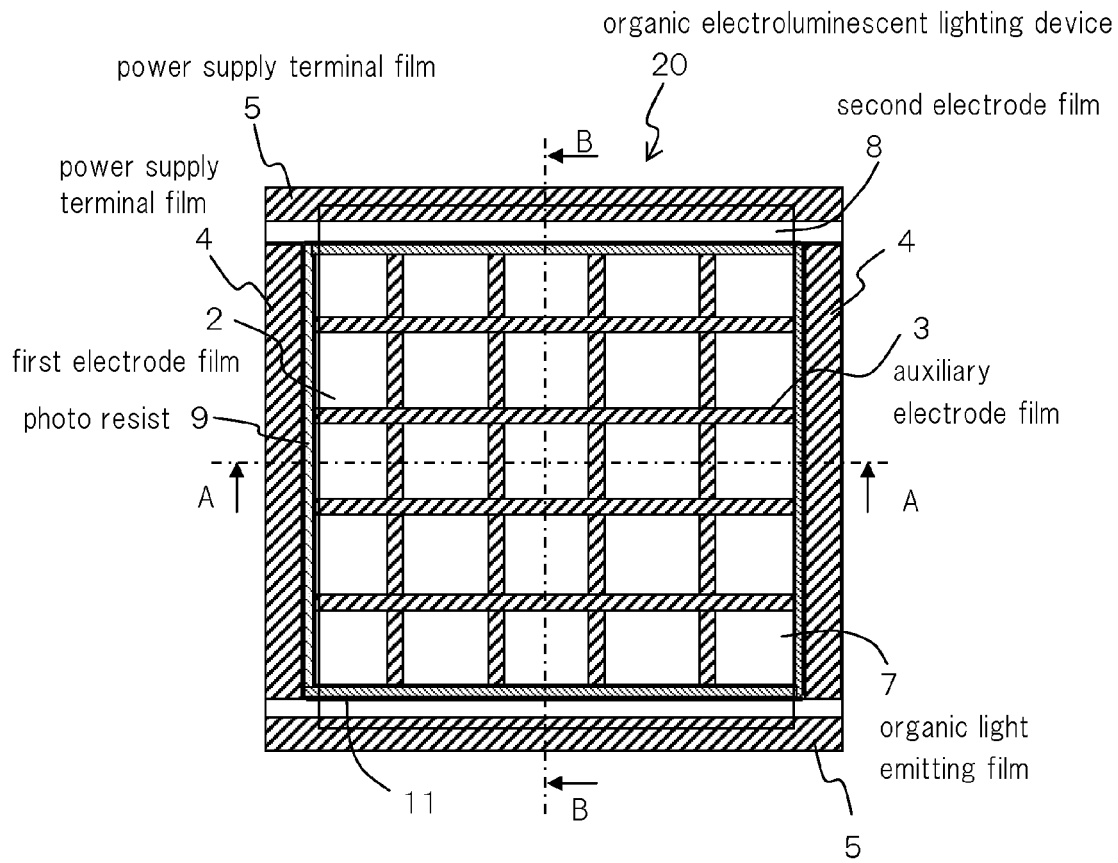
FIG. 5A A top view showing an organic electroluminescent lighting device according to the second embodiment of the present invention.
Figure 5B:
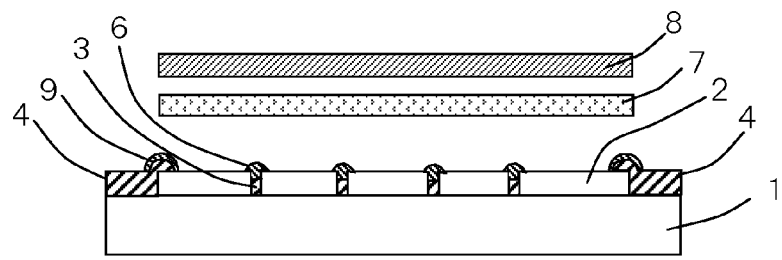
FIG. 5B A sectional view cut along the line A-A shown in FIG. 5A.
Figure 5C:
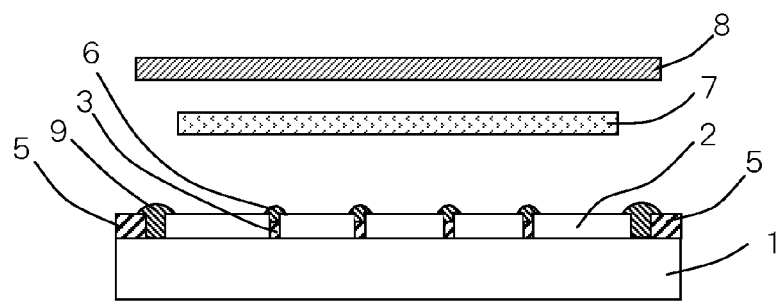
FIG. 5C A sectional view cut along the line B-B shown in FIG. 5A.

FIG. 5A is a top view showing organic electroluminescent lighting device 20 according to the second embodiment of the present invention. FIG. 5B is a sectional view cut along the line A-A shown in FIG. 5A. FIG. 5C is a sectional view cut along the line B-B shown in FIG. 5A. FIG. 5A shows the seen-through state of the inside of organic electroluminescent lighting device 20. FIGS. 5B and 5C show the separated state of organic light emitting film 7 and second electrode film 8 from organic electroluminescent lighting device 20. Hereinafter, differences from organic electroluminescent lighting device 10 will be described in detail, while detailed description of similarities to organic electroluminescent lighting device 10 will be omitted.

In organic electroluminescent lighting device 10 of the first embodiment, power supply terminal films 4 and 5 are made of the transparent conductive materials (or transparent metal oxides) similar to those of first electrode films 2. On the other hand, in organic electroluminescent lighting device 20 of this embodiment, power supply terminal films 4 and 5 are made of metallic materials similar to those of auxiliary electrode films 3. The metallic material used for auxiliary electrode film 3 has electrical resistivity that is lower than that of a transparent metal oxide used for first electrode film 2. Thus, the resistance of power supply terminal films 4 and 5 is lower than that of the first embodiment. As a result, organic electroluminescent lighting device 20 of the embodiment can reduce a driving voltage required to cause organic light emitting film 7 to emit more light than organic electroluminescent lighting device 10 of the first embodiment. Referring to FIGS. 6A to 6E, the manufacturing process of organic electroluminescent lighting device 20 of the embodiment will be described. FIGS. 6A to 6E are top views showing the manufacturing process of organic electroluminescent lighting device 20 of the embodiment.

Figure 6A:
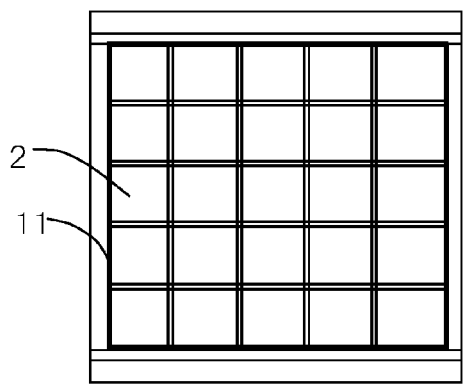
FIG. 6A A top view showing a part of the manufacturing process of the organic electroluminescent lighting device shown in FIG. 5A.

First, as in the case of the first embodiment, a plurality of first electrode films 2 are spaced from each other in a matrix on the surface of transparent substrate 1 (refer to FIG. 6A).

Figure 6B:
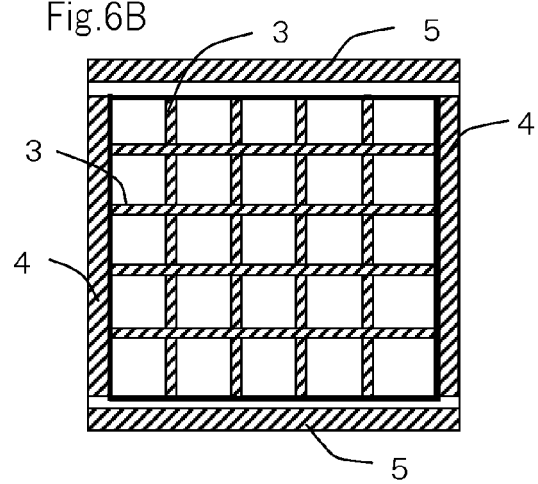
FIG. 6B A top view showing the next manufacturing process of the manufacturing process shown in FIG. 6A.
Figure 6C:
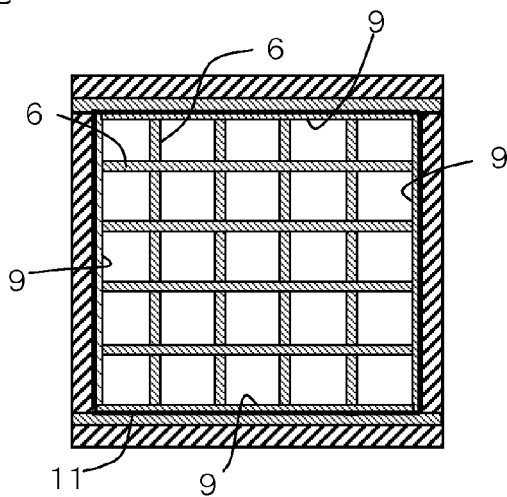
FIG. 6C A top view showing the next manufacturing process of the manufacturing process shown in FIG. 6B.

Then, auxiliary electrode films 3 are formed between first electrode films 2 in a lattice shape, and power supply terminal films 4 and 5 are formed by using metallic materials similar to those of auxiliary electrode films 3, such as Al (aluminum), Cr (chromium), Mo (molybdenum), Mo—Nb (molybdenum-niobium alloy), or Al—Nd (aluminum-neodymium alloy) (refer to FIG. 6B).

Then, insulating film 6 is formed by depositing a photoresist on the surface of auxiliary electrode film 3. Photoresist 9 is also deposited on the peripheral edge portion of arrangement region 11 where the plurality of first electrode films 2 and auxiliary electrode films 3 are arranged. Photoresists can be deposited between first electrode film 2 and power supply terminal film 5 and between power supply terminal film 4 and power supply terminal film 5 (refer to FIG. 6C).

Figure 6D:
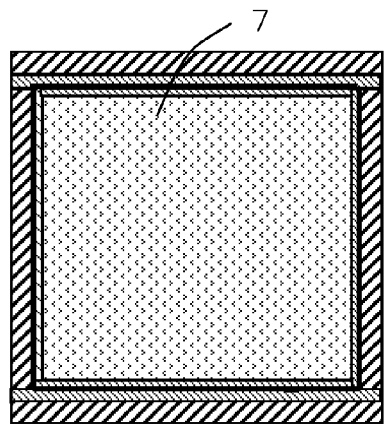
FIG. 6D A top view showing the next manufacturing process of the manufacturing process shown in FIG. 6C.

Then, organic light emitting film 7 is formed to cover first electrode films 2 and insulating films 6 excluding the peripheral edge portion of arrangement region 11 on which photoresist 9 has been deposited (refer to FIG. 6D). In this case, since photoresist 9 covering the peripheral edge portion of arrangement region 11 functions as a mask, organic light emitting film 7 can be formed without using any shadow mask of high alignment accuracy. Thus, the forming process of organic light emitting film 7 is simplified.

Figure 6E:
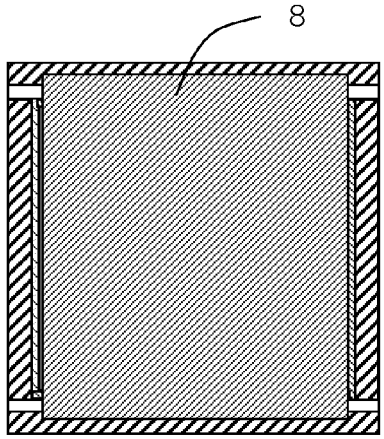
FIG. 6E A top view showing the next manufacturing process of the manufacturing process shown in FIG. 6D.

Lastly, second electrode film 8 is formed to cover the surface of organic light emitting film 7 and power supply terminal film 5 (refer to FIG. 6E).

(Third Embodiment)

FIGS. 7A to 7E are top views showing the manufacturing process of an organic electroluminescent lighting device according to the third embodiment of the present invention. Hereinafter, differences from organic electroluminescent lighting devices 10 and 20 will be described in detail, while detailed description of similarities to organic electroluminescent lighting devices 10 and 20 will be omitted.

Figure 7A:
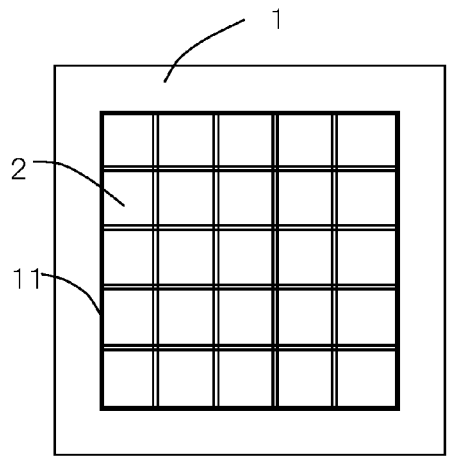
FIG. 7A A top view showing an organic electroluminescent lighting device according to the third embodiment of the present invention, and a part of the manufacturing process of the organic electroluminescent lighting device.

First, as in the case of the first and second embodiments, a plurality of first electrode films 2 are formed on the surface of transparent substrate 1 (refer to FIG. 7A).

Figure 7B:
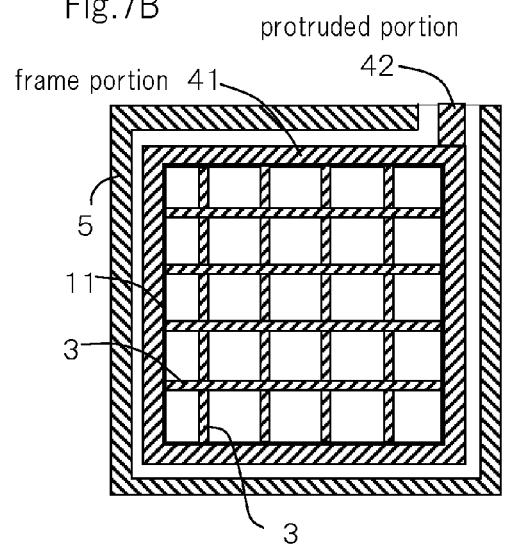
FIG. 7B A top view showing the next manufacturing process of the manufacturing process shown in FIG. 7A.
Figure 7C:
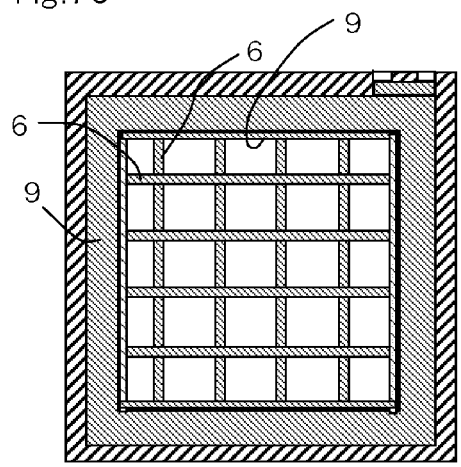
FIG. 7C A top view showing the next manufacturing process of the manufacturing process shown in FIG. 7B.

Then, auxiliary electrode films 3 are formed between first electrode films 2 in a lattice shape, and power supply terminal films 4 and 5 are formed by using metallic materials similar to those of auxiliary electrode films 3. In the embodiment, as shown in FIG. 7B, power supply terminal film 4 is formed into a shape having frame portion 41 that continuously surrounds arrangement region 11 and protruded portion 42 that extends from frame portion 41 to the outside of arrangement region 11. On the other hand, as shown in FIG. 7B, power supply terminal film 5 is formed into a shape to continuously surround frame portion 41 of power supply terminal film 4 excluding protruded portion 42. Thus, since power can be supplied to first electrode film 2 and second electrode film 8 from four directions, voltage can be uniformly applied to organic light emitting film 4. As a result, the luminance of organic light emitting film 4 can be made uniform.

Then, insulating film 6 is formed by depositing a photoresist on the surface of auxiliary electrode film 3. Photoresist 9 is also deposited on the peripheral edge portion of arrangement region 11. Further, photoresist 9 is deposited on the surface of power supply terminal film 4 excluding the leading end of protruded portion 42 (refer to FIG. 7C).

Figure 7D:
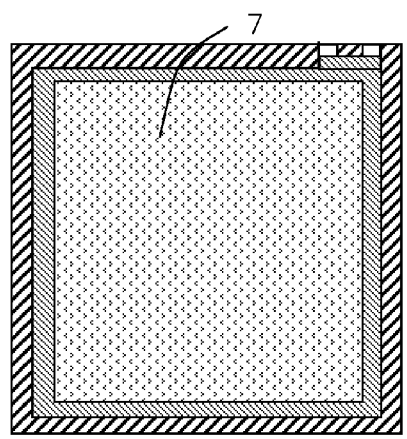
FIG. 7D A top view showing the next manufacturing process of the manufacturing process shown in FIG. 7C.

Then, organic light emitting film 7 is formed to cover first electrode films 2 and insulating films 6 so that it can make contact with the deposited portion of photoresist 9 (refer to FIG. 7D). In this case, since photoresist 9 functions as a mask, organic light emitting film 7 can be formed without using any shadow mask having high alignment accuracy. Thus, the forming process of organic light emitting film 7 is further simplified.

Figure 7E:
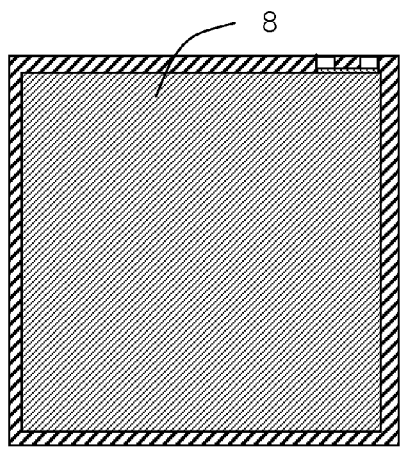
FIG. 7E A top view showing the next manufacturing process of the manufacturing process shown in FIG. 7D.

Lastly, second electrode film 8 is formed to cover or make contact with the surface of organic light emitting film 7 and power supply terminal film 5 (refer to FIG. 7E). In this case, since photoresist 9 functions as the mask, second electrode film 8 can be formed without using any shadow mask having high alignment accuracy. Thus, the forming process of second electrode film 8 is further simplified.

Hereinafter, the specific Examples of the first to third embodiments will be described.

EXAMPLE 1

This Example corresponds to the first embodiment. In organic light emitting film 7 of the Example, Cu—Pc (copper phthalocyanine) is used as a hole injection material. As a hole transport material, α-NPD (N,N'-diphenyl-N—N-bis(1-naphtyl)-1,1'-biophenyl)-4,4'-diamine) is used. For a first light emitting layer, using CBP (4,4'-biscarbazolyl biphenyl) as a host, a material doped with Ir (ppy) 3(tris-(2phenylpyridine)iridium complex) and Btp2Ir (acac) (bis(2-(2'-benzo(4, 5-α)thienyl)pyridinate-N,C2') (acetylacetonate) iridium complex) is used. Further, for a second light emitting layer, using CBP as a host, a material doped with FIr (pic) ((bis(4, 6-di-fluorophenyl)-pyridinate-N,C2') picolinate iridium complex) is used. For a hole block layer, BCP (2,9-dimethyl-4,7-diphenyl-1,10-phenanthroline) is used. For an electron transport layer, Alq3 is used. LiF is used as an electron injection material. Al is used for a cathode (second electrode film 8).

When the organic electroluminescent lighting device of the Example was lit with driving current set as constant current of 25 A/m$^2$, a driving voltage was 4.8 V, and luminance was 920 cd/m$^2$. Luminance unevenness within the plane of the organic electroluminescent lighting device was 4% at 9 measurement points within the plane based on calculating of (difference between maximum luminance and minimum luminance)/maximum luminance. When the organic electroluminescent lighting device was continuously lit at the aforementioned current density, the lighting was stably continued even after 10000 hours.

EXAMPLE 2

This Example corresponds to the second embodiment. In organic light emitting film 7 of the Example, Cu—Pc is used as a hole injection material. As a hole transport material, α-NPD is used. For a first light emitting layer, using CBP as a host, a material doped with Ir (ppy) 3 and Btp2Ir (acac) is used. Further, for a second light emitting layer, using CBP as a host, a material doped with Flr (pic) is used. For a hole block layer, BCP is used. For an electron transport layer, Alq3 is used. LiF is used as an electron injection material. Al is used for a cathode (second electrode film 8).

When the organic electroluminescent lighting device of the Example was lit with driving current set as constant current of 25 A/m$^2$, the driving voltage was 4.6 V, and luminance was 915 cd/m$^2$. Luminance unevenness within the plane of the organic electroluminescent lighting device was 4% at 9 measurement points within the plane based on calculating of (difference between maximum luminance and minimum luminance)/maximum luminance. When the organic EL lighting device was continuously lit at the aforementioned current density, the lighting was stably continued even after 10000 hours.

EXAMPLE 3

This Example corresponds to the third embodiment. In organic light emitting film 7 of the Example, Cu—Pc is used as a hole injection material. As a hole transport material, α-NPD is used. For a first light emitting layer, using CBP as a host, a material doped with Ir (ppy) 3 and Btp2Ir (acac) is used. Further, for a second light emitting layer, using CBP as a host, a material doped with Flr (pic) is used. For a hole block layer, BCP is used. For an electron transport layer, Alq3 is used. LiF is used as an electron injection material. Al is used for a cathode (second electrode film 8).

When the organic electroluminescent lighting device of the Example was lit with driving current set as constant current of 25 A/m$^2$, the driving voltage was 4.4 V, and luminance was 920 cd/m$^2$. Luminance unevenness within the plane of the organic electroluminescent lighting device was 3% at 9 measurement points within the plane based on calculating of (difference between maximum luminance and minimum luminance)/maximum luminance. When the organic EL lighting device was continuously lit at the aforementioned current density, the lighting was stably continued even after 10000 hours.

COMPARATIVE EXAMPLE 1

Figure 1A:
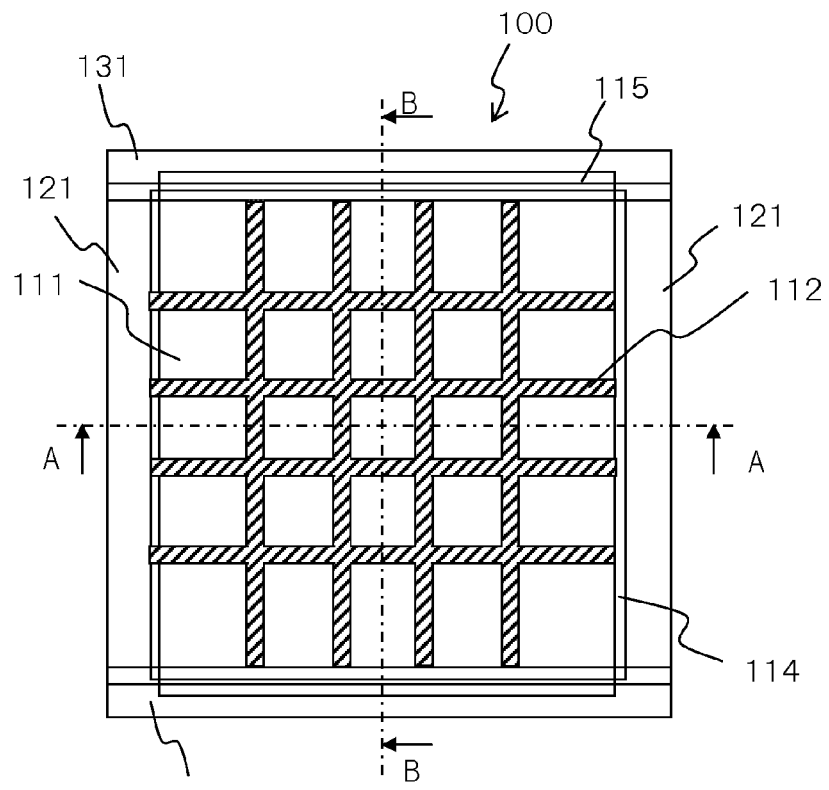
FIG. 1A A top view showing an organic electroluminescent lighting device according to the present invention.
Figure 1B:
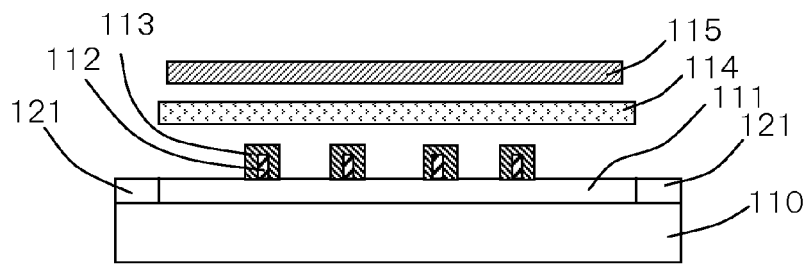
FIG. 1B A sectional view cut along the line A-A shown in FIG. 1A.
Figure 1C:
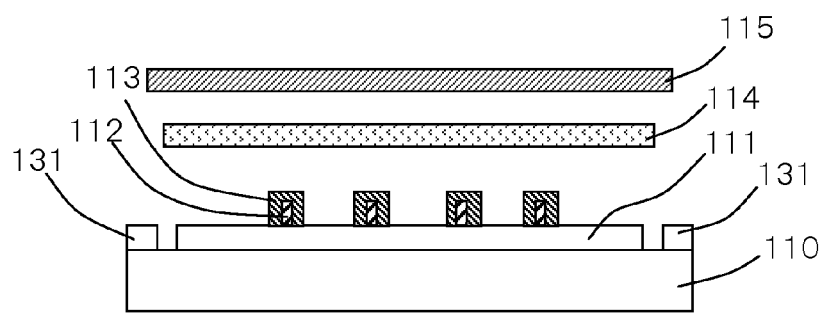
FIG. 1C A sectional view cut along the line B-B shown in FIG. 1A.
Figure 2A:
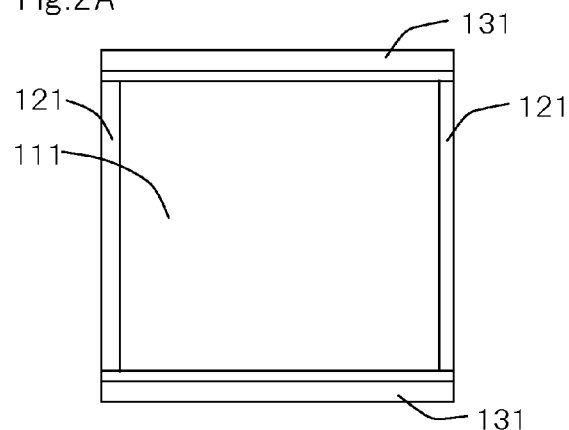
FIG. 2A A top view showing a part of the manufacturing process of the organic electroluminescent lighting device shown in FIG. 1A.
Figure 2B:
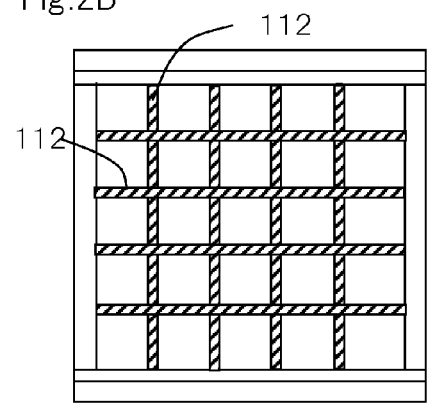
FIG. 2B A top view showing the next manufacturing process of the manufacturing process shown in FIG. 2A.
Figure 2C:
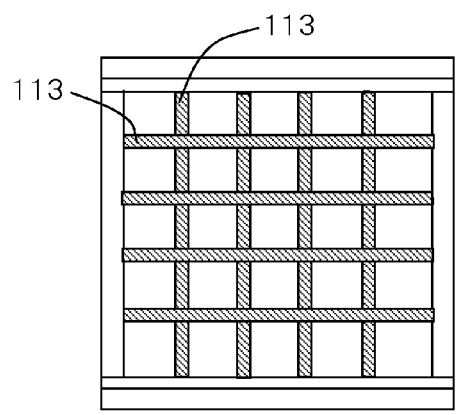
FIG. 2C A top view showing the next manufacturing process of the manufacturing process shown in FIG. 2B.
Figure 2D:
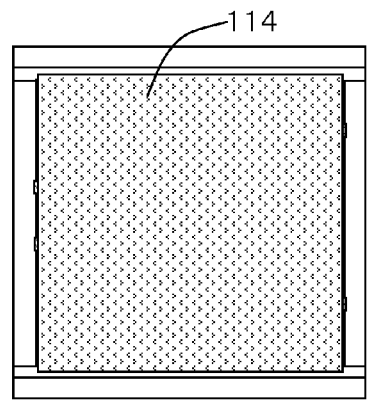
FIG. 2D A top view showing the next manufacturing process of the manufacturing process shown in FIG. 2C.
Figure 2E:
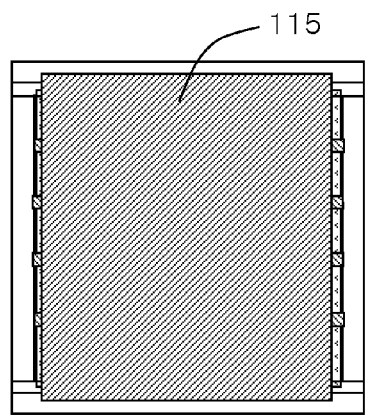
FIG. 2E A top view showing the next manufacturing process of the manufacturing process shown in FIG. 2D.

As Comparative Example 1, an organic electroluminescent lighting device related to that of the present invention shown in FIG. 1A was manufactured, and driven at a current density similar to that described above. As a result, a driving voltage was 5.1 V, and luminance was 880 cd/m$^2$. Luminance unevenness within the plane of the organic electroluminescent lighting device was 9% at 9 measurement points within the plane based on calculating of (difference between maximum luminance and minimum luminance)/maximum luminance. When the organic electroluminescent lighting device was continuously lit under the aforementioned conditions, short-circuiting occurred within 500 hours, and the organic electroluminescent lighting device was unlit.

COMPARATIVE EXAMPLE 2

As Comparative Example 2, an organic electroluminescent lighting device that did not has an auxiliary electrode film was manufactured, and driven at a current density similar to that described above. As a result, the driving voltage was 5.7 V, and luminance was 790 cd/m$^2$. Luminance unevenness within the plane of the organic electroluminescent lighting device was 30% at 9 measurement points within the plane based on calculating of (difference between maximum luminance and minimum luminance)/maximum luminance. When the organic electroluminescent lighting device was continuously lit under the aforementioned conditions, short-circuiting occurred within 1000 hours, and the organic electroluminescent lighting device was unlit.

Thus, the organic electroluminescent lighting devices according to the Examples 1 to 3 can secure stable lighting for a long time compared with the organic electroluminescent lighting devices of the Comparative Examples 1 and 2.

The embodiments of the present invention have been described. However, the present invention is not limited to the embodiments. Various changes understandable to those skilled in the art can be made of the configuration and the specifics of the present invention.

This application claims priority from Japanese Patent Application No. 2010-293101 filed Dec. 28, 2010, which is hereby incorporated by reference herein in its entirety.

REFERENCE NUMERALS

1, 110 Transparent substrate
2 First electrode film
4, 5, 121, 131 Power supply terminal film
6, 113 Insulating film
7, 114 Organic light emitting film
8 Second electrode film
41 Frame portion
42 Protruded portion
10, 20, 100 Organic electroluminescent lighting device
111, 115 Electrode film

The invention claimed is:

1. An organic electroluminescent lighting device comprising:
   a transparent substrate;
   a plurality of transparent first electrode films spaced from each other on a surface of the transparent substrate;
   auxiliary electrode films which are formed on the surface of the transparent substrate and which are arranged between the plurality of first electrode films, wherein a height from the surface of the transparent substrate to upper surfaces of the auxiliary electrode films is lower than a height from the surface of the transparent substrate to upper surfaces of the first electrode films, wherein the auxiliary electrode films have electrical resistivity lower than that of the first electrode films, and are electrically connected to the plurality of first electrode films;
   insulating films covering the auxiliary electrode films;
   power supply terminal films arranged on the surface of the transparent substrate adjacently to an arrangement region in which the plurality of first electrode films and the auxiliary electrode films are arranged, and electrically connected to the plurality of first electrode films and the auxiliary electrode films;
   an organic light emitting film covering the first electrode films and the insulating films; and
   a second electrode film covering the organic light emitting film.

2. The organic electroluminescent lighting device according to claim 1, further comprising a photoresist deposited on the surface of the transparent substrate to cover a peripheral edge portion of the arrangement region,
   wherein the organic light emitting film covers the first electrode films and the insulating films excluding the peripheral edge portion of the arrangement region.

3. The organic electroluminescent lighting device according to claim 1,
   the power supply terminal films including frame portions that continuously surround the arrangement region and protruded portions that extend from the frame portions to the outside of the arrangement region,
   the lighting device further comprising other power supply terminal films which continuously surrounds the frame portions of the power supply terminal films excluding the protruded portions and which are covered with the second electrode.

4. A method for manufacturing an organic electroluminescent lighting device, comprising:
   a first step of forming a plurality of transparent first electrode films spaced from each other on a surface of a transparent substrate, auxiliary electrode films which are formed on the surface of the transparent substrate and which are arranged between the plurality of first electrode films, wherein a height from the surface of the transparent substrate to upper surfaces of the auxiliary electrode films is lower than a height from the surface of the transparent substrate to upper surfaces of the first electrode films, wherein the auxiliary electrode films have electrical resistivity lower than that of the first electrode films, and are electrically connected to the plurality of first electrode films, and power supply terminal films arranged adjacently to an arrangement region in which the plurality of first electrode films and the auxiliary electrode films are arranged, and electrically connected to the plurality of first electrode films and the auxiliary electrode films;
   a second step of forming insulating films covering the auxiliary electrode films;
   a third step of forming an organic light emitting film covering the first electrode films and the insulating films; and
   a fourth step of forming a second electrode film covering the organic light emitting film.

5. The method for manufacturing the organic electroluminescent lighting device according to claim 4, wherein:
   in the second step, the insulating films are formed and a photoresist is deposited on a peripheral edge portion of the arrangement region; and
   in the third step, the organic light emitting film is formed excluding the peripheral edge portion of the arrangement region.

6. The method for manufacturing the organic electroluminescent lighting device according to claim 4, wherein:
   in the first step, the power supply terminal films are formed into shapes including frame portions that continuously surround the arrangement region and protruded portions that extend from the frame portions to the outside of the arrangement region, and other power supply terminal films are formed to continuously surround the frame portions of the power supply terminal films excluding the protruded portions; and
   in the fourth step, the second electrode film is formed to cover the organic light emitting film and the other power supply terminal films.

\* \* \* \* \*